(12) United States Patent
Brioschi et al.

(10) Patent No.: US 11,814,284 B2
(45) Date of Patent: Nov. 14, 2023

(54) COMPOSITE STRUCTURES

(71) Applicant: Cirrus Logic International Semiconductor Ltd., Edinburgh (GB)

(72) Inventors: Roberto Brioschi, Austin, TX (US); Rkia Achehboune, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 549 days.

(21) Appl. No.: 16/825,593

(22) Filed: Mar. 20, 2020

(65) Prior Publication Data

US 2020/0299127 A1  Sep. 24, 2020

Related U.S. Application Data

(60) Provisional application No. 62/822,199, filed on Mar. 22, 2019.

(30) Foreign Application Priority Data

Apr. 29, 2019 (GB) .................................... 1905930

(51) Int. Cl.
| | | |
|---|---|---|
| H01L 23/00 | (2006.01) | |
| B81C 1/00 | (2006.01) | |
| B81B 3/00 | (2006.01) | |
| H04R 19/00 | (2006.01) | |

(52) U.S. Cl.
CPC .......... B81C 1/0023 (2013.01); B81B 3/0021 (2013.01); B81C 1/00253 (2013.01); H01L 24/19 (2013.01); H04R 19/005 (2013.01); *B81B 2201/0257* (2013.01); *B81B 2201/0264* (2013.01); *B81B 2203/0127* (2013.01); *H01L 2924/1461* (2013.01); *H04R 2201/003* (2013.01)

(58) Field of Classification Search
CPC ............. B81C 1/00253; B81C 1/0023; B81C 1/00309; B81C 2203/0109; H04R 19/005; H04R 19/04; H04R 2201/003; H04R 1/04; B81B 3/0021; B81B 2207/096; B81B 2203/0127; B81B 2201/0264; B81B 2201/0257; B81B 2207/092; B81B 2207/012; H01L 24/19; H01L 2924/1461
See application file for complete search history.

(56) References Cited

U.S. PATENT DOCUMENTS

| 11,337,010 B2* | 5/2022 | Piechocinski .......... H04R 19/04 |
|---|---|---|
| 2010/0047567 A1 | 2/2010 | Souriau |
| 2010/0195299 A1 | 8/2010 | Souriau et al. |

(Continued)

FOREIGN PATENT DOCUMENTS

| EP | 2427040 A1 | 3/2012 | |
|---|---|---|---|
| WO | 2016153871 A1 | 9/2016 | |
| WO | WO-2016153871 A1 * | 9/2016 | ........... B81B 7/0061 |

OTHER PUBLICATIONS

Merriam-Webster OnLine Dictionary Definition of "frame." No date.*

(Continued)

*Primary Examiner* — Hrayr A Sayadian
(74) *Attorney, Agent, or Firm* — Jackson Walker L.L.P

(57) ABSTRACT

The application relates to structures, e.g. substrates for supporting semiconductor die. The substrate defines a frame which lateral surrounds one or more die and is provided in contact with at least one side surface of the die, wherein the frame defines upper and lower surfaces of the substrate.

2 Claims, 8 Drawing Sheets

(56) References Cited

U.S. PATENT DOCUMENTS

| | | | |
|---|---|---|---|
| 2011/0121413 A1* | 5/2011 | Allen | B81B 7/0041 |
| | | | 257/416 |
| 2014/0042565 A1* | 2/2014 | Fuergut | B81B 7/0041 |
| | | | 438/51 |
| 2016/0167949 A1* | 6/2016 | Jiang | B81C 3/001 |
| | | | 257/415 |
| 2017/0332176 A1 | 11/2017 | Pantel et al. | |
| 2018/0233469 A1 | 8/2018 | Palm et al. | |
| 2021/0144482 A1* | 5/2021 | Piechocinski | B81B 3/0021 |

OTHER PUBLICATIONS

Combined Search and Examination Report under Sections 17 and 18(3), UKIPO, Application No. GB1905930.2, dated Oct. 3, 2019.
Examination Report under Section 18(3), UKIPO, Application No. GB1905930.2, dated May 25, 2021.
Examination Report under Section 18(3), UKIPO, Application No. GB1905930.2, dated Oct. 30, 2020.
Examination Report under Section 18(3), UKIPO, Application No. GB1905930.2, dated Jan. 7, 2022.
Examination Report under Section 18(3), UKIPO, Application No. GB1905930.2, dated Oct. 6, 2022.
Examination Report under Section 18(3), UKIPO, Application No. GB1905930.2, dated Jun. 5, 2023.

* cited by examiner

Figure 1
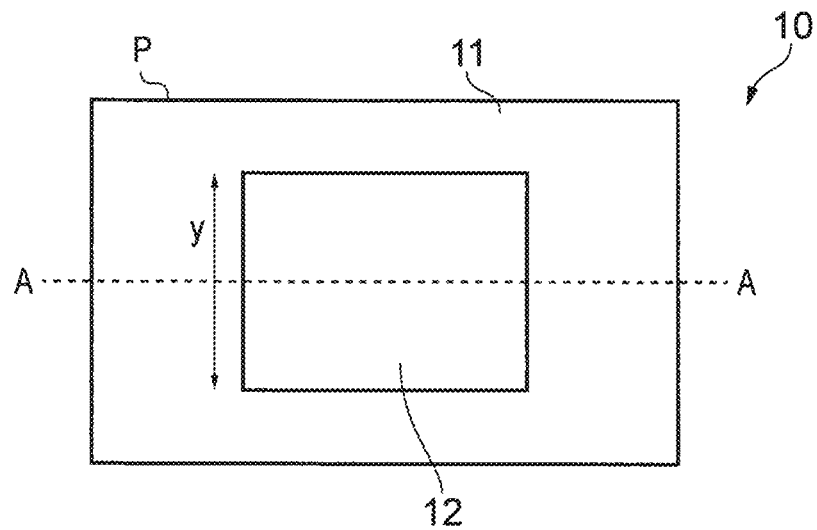
FIG. 1a
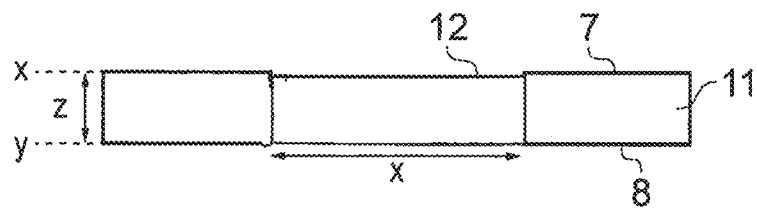
FIG. 1b
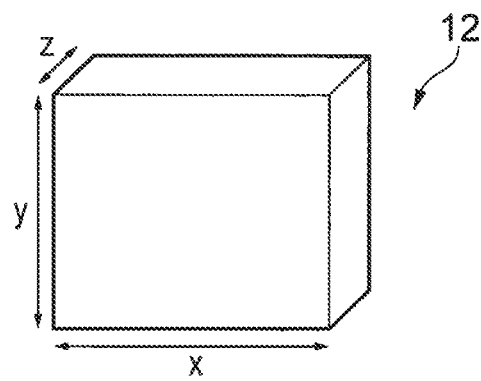
FIG. 1c

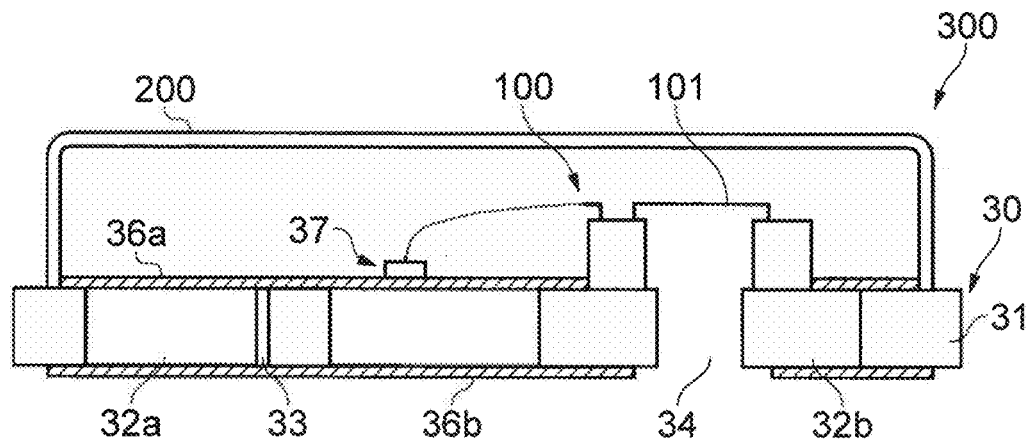
FIG. 6
Figure 7
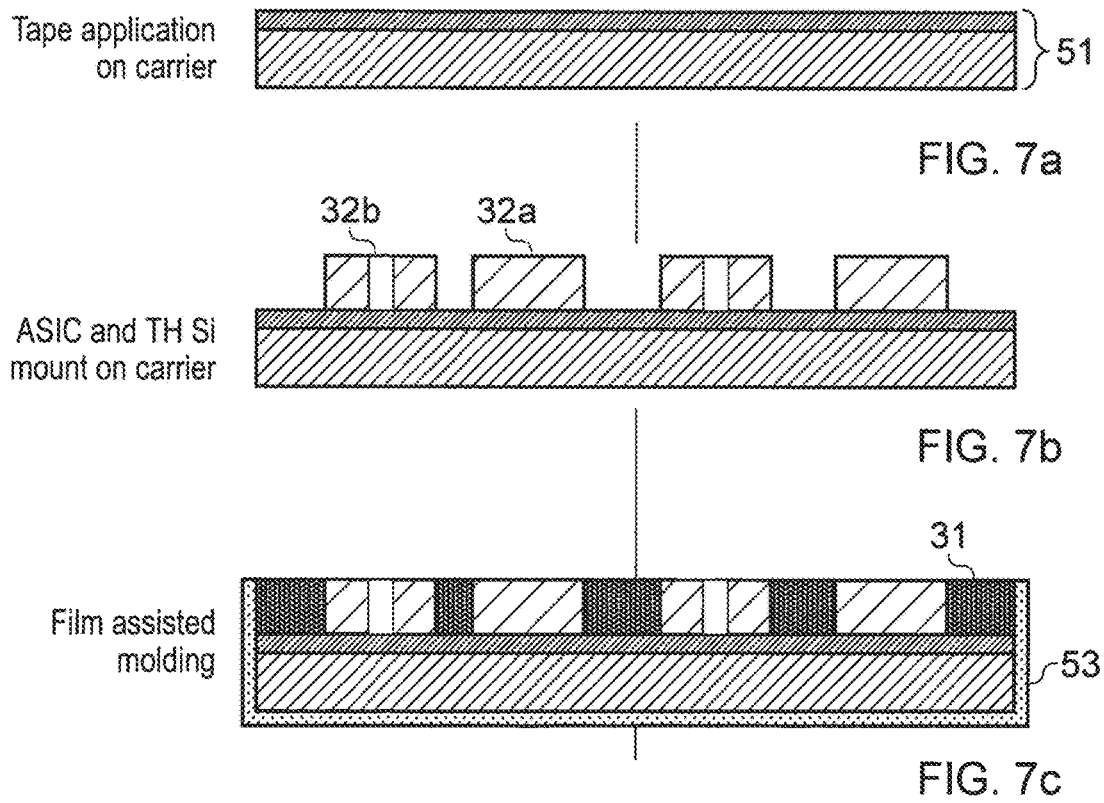
FIG. 7a
FIG. 7b
FIG. 7c

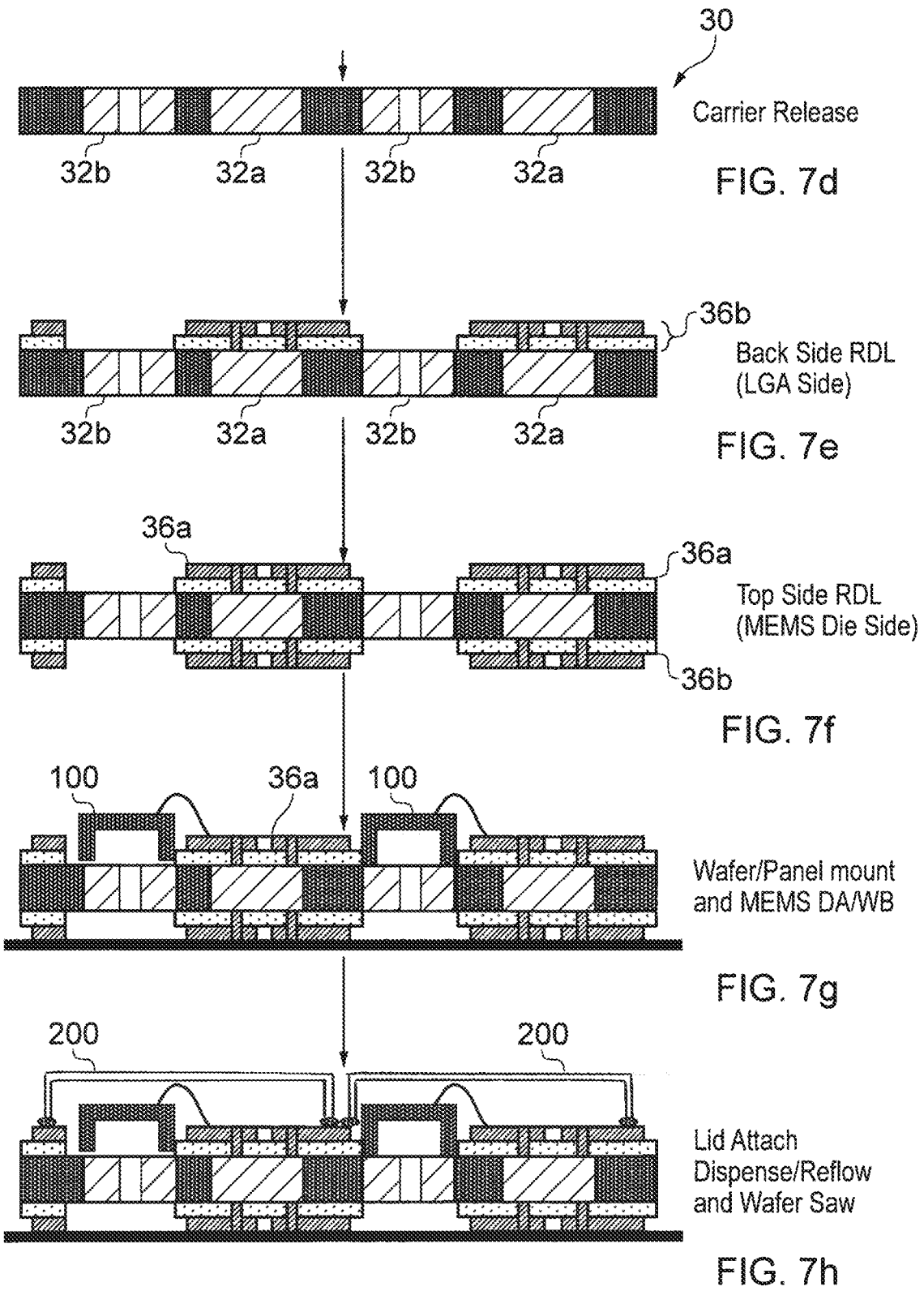

COMPOSITE STRUCTURES

The present application relates to structures for supporting one or more components, such as mechanical and/or electrical and/or electromechanical components and to methods of fabricating such structures. In particular, the present application relates to structures for supporting components such as MEMS transducers, circuitry die or mechanical sub-structures. The present application also describes packages for housing one or more components and packaging techniques for the fabrication thereof.

Many miniaturised components, such as MEMS transducer die or integrated circuitry die, are mounted and/or supported by a substrate. The substrate may form part of a package structure which allows easy handling and assembly and serves to protect the die from e.g. mechanical damage, RF noise and environmental contamination. The package structure may also provide a means for connecting the package to a circuit board or other elements of a host device. The package typically comprises a cap or cover portion which is provided on a first, or upper, surface of the support substrate. Thus the cover portion extends in a plane overlying the upper surface of the substrate and defines a chamber of the package within which one or more components—e.g. device or circuitry chips—are housed.

Thus, according to previously proposed arrangements one or more die are mounted on a supporting surface of the package substrate. This may be achieved through a process known as discrete die mounting. It will be appreciated that mounting a die to the upper surface of a package substrate results in the component being located within the chamber of the package cavity. Thus, the die occupies volume within the chamber. This has potential consequences for the headroom available within the chamber, the performance of the component(s) and the size—in particular the height—of the packaged component(s).

The present aspects and examples relate to structures and/or substrates for supporting one or more components e.g. die. In particular, but not necessarily, the present aspects and examples relate to structures or substrates for supporting at least one semiconductor die. In particular, the present aspects seek to provide arrangements which provide an improvement or gain in the available volume within a package structure. Additionally or alternatively, the present aspects and examples seek to provide support structures which are particularly suitable for wafer and/or batch-level processing techniques.

According to at least one example of a first aspect there is provided a substrate for a MEMS transducer package comprising:
  at least one die; and
  a frame laterally surrounding and in contact with a side surface of the die.

The die may be a silicon die. The frame may be a moulded frame. Within the context of the present invention a die or "chip" may be considered to comprise a portion or unit of material, in particular semiconductor material, which provides a particular function and/or which supports one or more elements or features having a particular function. For example, a die may comprise an integrated circuit (IC), an application specific integrated circuit (ASIC) or a MEMS transducer such as MEMS microphone transducer die. A die may also provide some other function. A further example of a component or die is a port-hole die wherein a die of material comprises a hole which extends through the die from an opening in an upper surface of the die to an opening in a lower surface thereof.

According to at least one example a die may be considered to exhibit a footprint which defines a closed shape, which will typically be square or rectangular. The die may be considered to be generally planar in form. Furthermore, the plane of the die may be arranged to be substantially aligned with, or substantially parallel to, the plane of the substrate as a whole.

The frame may be formed of a mould material, e.g. an epoxy mould material, a polymer or a polymeric material. The mould material is preferably a hardenable or settable material which may be dispensed or applied in liquid form and manipulated to define the required shape and dimensions of the frame.

According to at least one example of the first aspect the die is provided between a first substrate plane defined by an upper surface of the frame and a second substrate plane defined by a lower surface of the frame. The lower surface of the die may be coplanar with the second substrate plane. The distance between the first substrate plane and the second substrate plane can be considered to define a planar height of the substrate. The height of the die may be less than or equal to the planar height of the substrate.

According to at least one example one or more through planar vias extend between the first substrate plane and the second substrate plane. The vias, which may be metal plated, facilitate an electrical connection between the first and second substrate planes. Thus, a through planar via may be formed in the die, which may be a silicon die, and will therefore be a through silicon via. Additionally or alternatively, one or more vias may be provided through the moulded frame (TMV).

According to at least one example the substrate comprises first and second die. The frame laterally surrounds both first and second die. The first and second die may be considered to be held in fixed positional relationship relative to each other by means of the frame structure. The frame structure may be considered to be a connecting frame. According to at least one example the first die is an ASIC and the second die is a port-hole die.

According to at least one example a MEMS microphone transducer is provided on the upper surface of the substrate. The MEMS microphone transducer typically comprises a flexible membrane which deflects in response to a pressure differential across the membrane, and wherein the MEMS microphone transducer is provided such that the flexible membrane overlies a hole provided in the port hole die.

According to at least one example of a second aspect there is provided a MEMS transducer package comprising a substrate according to at least one example of the first aspect further comprising a lid portion, the lid portion being provided on the upper surface of the package substrate to define a chamber.

According to a further aspect there is provided an electronic device comprising a MEMS transducer package according to an example of the second aspect. For example the device may comprise: a portable device; a battery powered device; an audio device; a computing device; a communications device; a personal media player; a headphone; a mobile telephone; a games device; and a voice controlled device.

According to at least one example of a further aspect there is provided a method of fabricating a substrate according to an example of the first aspect. Thus, according to the present method, the frame is formed of a mould material which is applied to a region laterally surrounding the or each die and allowed to harden in order to form a bond between the material of the frame and at least one side surface of the die(s).

According to an example of a further aspect there is provided a composite substrate comprising one or more intra-planar die provided in a region between a first plane defined by the upper surface of the composite substrate and a second plane defined by the lower surface of the composite substrate.

For a better understanding of the present invention, and to show how the same may be carried into effect, reference will now be made by way of example to the accompanying drawings in which:

FIGS. 1a-1c, which may be collectively referred to as FIG. 1, illustrate a substrate according to a first example;

FIGS. 2a and 2b, which may be collectively referred to as FIG. 2, illustrate a substrate according to a second example;

Figure 4:
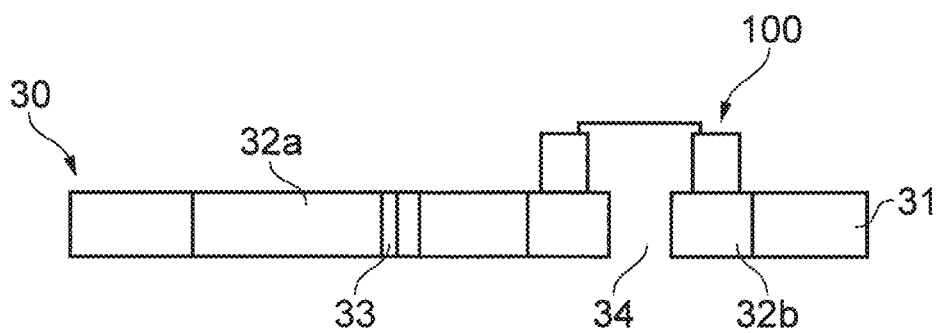
FIG. 4 illustrates a substrate as shown in FIG. 3 and further comprising a MEMS microphone transducer.
Figure 5A:
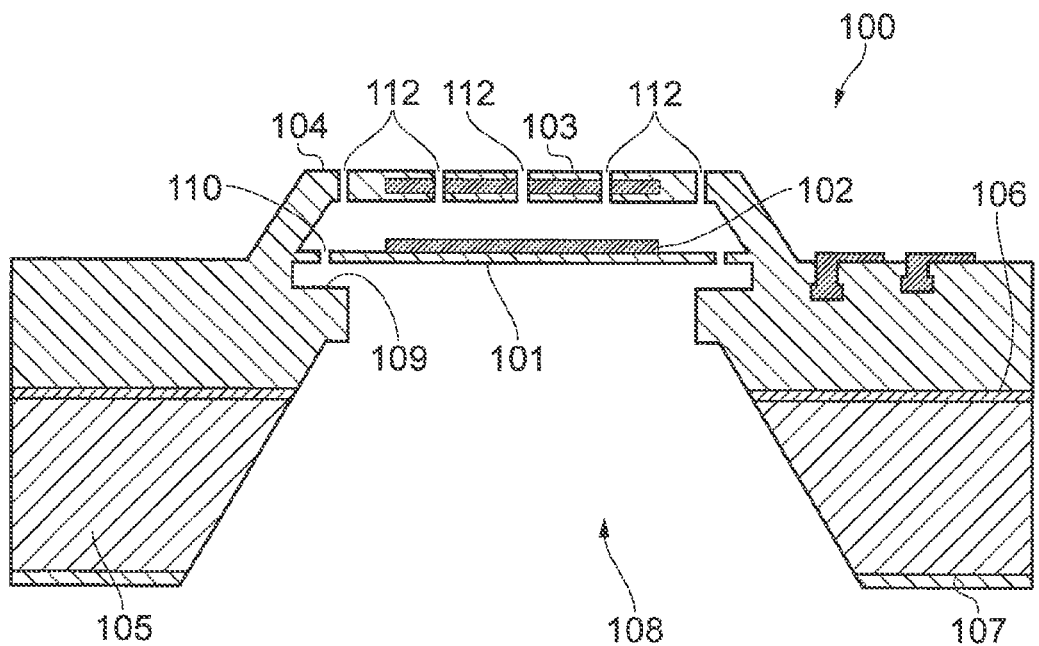
Figure 5B:
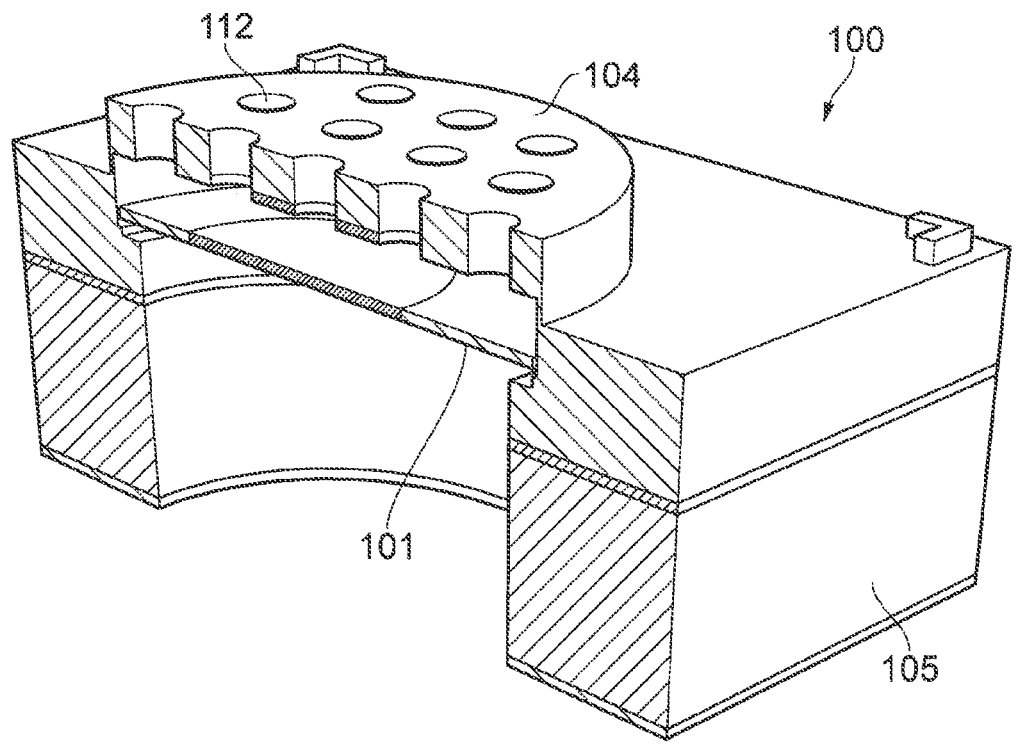

FIGS. 5a and 5b, which may be collectively referred to as FIG. 5, show a schematic diagram and a perspective view, respectively, of a known capacitive MEMS microphone die which may form the MEMS transducer die illustrated in FIG. 4;

FIG. 6 illustrates a package according to one example;

FIGS. 7a-7h, which may be collectively referred to as FIG. 7, illustrate a process flow for fabricating a package according to one example; and FIGS. 8a-8h, which may be collectively referred to as FIG. 8, illustrate some of the steps in the process flow of FIG. 7 at single unit level.

DETAILED DESCRIPTION

The description below sets forth examples and arrangements according to this disclosure. Further examples, arrangements and implementations will be apparent to those having ordinary skill in the art. Further, those having ordinary skill in the art will recognize that various equivalent techniques may be applied in lieu of, or in conjunction with, the examples discussed below, and all such equivalents should be deemed as being encompassed by the present disclosure.

Throughout this description any features which are the same or similar to features in other figures have been given the same reference numerals.

The present examples relate generally to a substrate suitable for a MEMS transducer package.

FIG. 1 illustrates a substrate 10 according to a first example. Specifically, FIG. 1a shows a plan view of the substrate 10 and FIG. 1b shows a cross-sectional view through the line A-A shown in FIG. 1a. The substrate 10 comprises a die 12, which in this example is generally rectangular in shape, and a frame structure 11. The frame structure 11 laterally surrounds the die 12 and forms a part of the substrate. Thus, the substrate 10 can be considered to be a composite structure comprising a planar, rigid frame and at least one die formed within the plane of the frame.

As shown in FIG. 1, the frame 11 is formed in contact with, or is connected to, the side surfaces of the die 12. The frame 11 defines the overall dimensions of the composite substrate when considered as a whole. Thus, the frame 11 essentially defines the perimeter boundary P of the substrate. Considering FIG. 1b, the frame comprises a first "upper" surface 7 and a second "lower" surface 8. A first plane X is defined by (i.e. is coincident with) the first upper surface of the frame whilst a lower plane Y is defined by (i.e. coincident with) the second, lower surface of the frame. The planar height Z of the substrate is determined by the distance between the first plane X and the second plane Y of the frame structure. Thus, the die 12 is provided between the first plane X and the second plane Y defined by the frame. In this sense the substrate can be considered to comprise an intra-planar die which is provided such that a lower surface of the intra-planar die is substantially coincident with the lower surface of the substrate, as defined by the frame structure, and wherein the height z of the die is largely or completely accommodated within the planar height Z of the frame.

In the present example the die 12 is generally planar in form and exhibits a generally rectangular shape. The dimensions of the die are defined by a length x, a width y and a height z. Thus, according to this particular example the height z of the die 12 is equal to or less than the planar height Z of the substrate. As such, the component can be considered to be provided entirely within the plane of the substrate. In circumstances where the substrate forms a substrate of a package comprising a chamber defined by a lid structure, it will be appreciated that the free volume of the chamber will be enhanced as a consequence of the component being provided within the plane of the package substrate.

It will be appreciated that in other examples the die may protrude to some extent above the surface but that a gain in available volume and/or a reduction in package height is nonetheless achieved.

The component 12 is illustrated in FIG. 1c. Generally, the component can be considered to be a portion or "die" of material, in particular semiconductor material such as silicon, which provides a particular function and/or which supports one or more elements or features.

Thus, the die 12 may be an integrated circuit (IC), the integrated circuit comprising one or more circuitry elements to provide a functional circuit. Alternatively, the die 12 may be a MEMS transducer die such as a MEMS microphone transducer. The die may also comprise both a transducer and circuitry integrated together on the same die. As a further alternative the die 12 may comprise a port-hole die—i.e. a die of material, which comprises a hole which extends through the die from an upper surface to a lower surface thereof. According to at least one arrangement the hole may be intended to form an acoustic port for allowing acoustic pressure waves to travel from the region below the lower surface of the die to the region above the upper surface of the die. Thus, for example, a substrate comprising a port-hole die may be provided for arrangements which require acoustic pressure waves to travel from a region below the die to the region above the die.

Figure 2A:
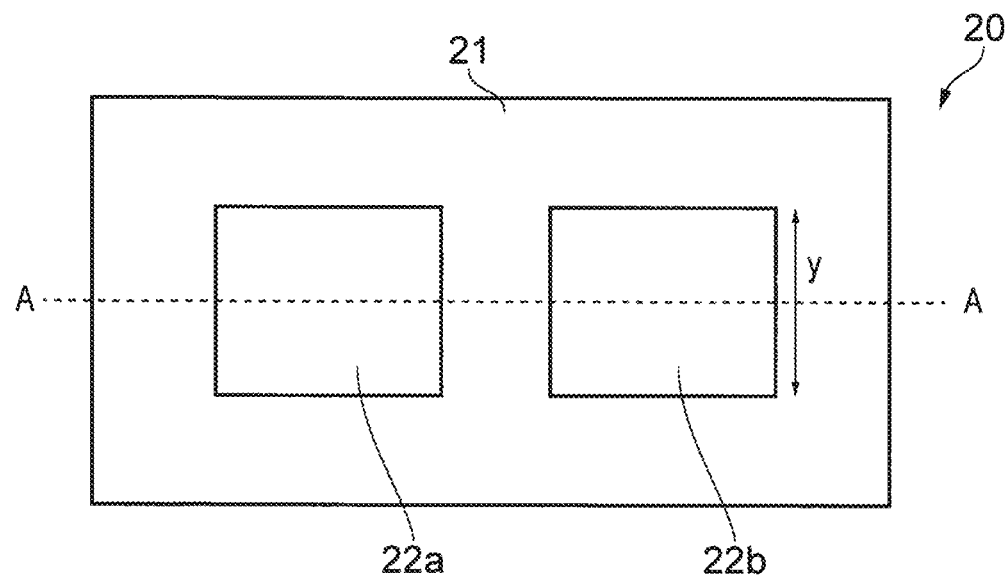
Figure 2B:
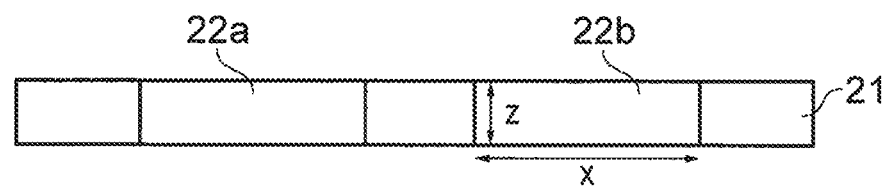

FIG. 2 illustrates a substrate 20 according to a second example. Specifically, FIG. 2a shows a plan view of the substrate 20 and FIG. 2b shows a cross-sectional view through the line A-A shown in FIG. 2a. The substrate 20 comprises a first die 22a and a second die 22b. The first and second dies are held in fixed positional relationship by means of a frame structure 21. The frame structure 21 laterally surrounds each of the first and second die and defines the overall plane of the substrate 20. Thus, the substrate 20 can be considered to be a composite structure comprising a planar frame and a pair of die formed within the plane of the frame. The substrate can be considered to comprise a pair of intra-planar die.

Figure 3:
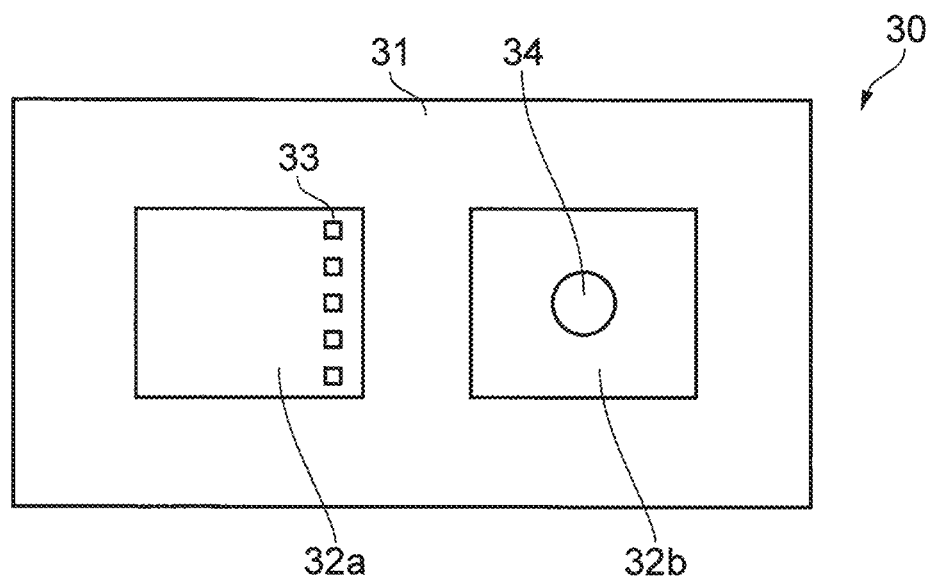
FIG. 3 illustrates a substrate according to a third example comprising an ASIC die and a port hole die.

FIG. 3 which shows a substrate 30 comprising an ASIC die 32a and a port-hole die 32b. The ASIC die 32a and the port-hole die 32*b* are held in a fixed positional arrangement by means of a frame structure 31. The frame structure 31 laterally surrounds both the ASIC die 32*a* and the port hole die 32*b* and defines the overall plane of the substrate 30. The port-hole die is a die of semiconductor material having a hole 34 which extends through the die from an opening in an upper surface of the die 32*b* to an opening in a lower surface thereof. The ASIC die may optionally comprise a plurality of through silicon vias (TSV) 33. As will be known by those skilled in the art a TSV is a vertical electrical connection that passes completely through the die and may be used, in conjunction with an associated bond pad, as an electrical interconnect to facilitate connection to an adjacent level or plane of interconnect within a package structure. Thus, a TSV facilitates an electrical connection to be formed through the plane of the die in order to form connections between a region above the upper surface of the die and a region below the surface of the die. In an alternative embodiment a through planar via is formed through the moulded frame and may be considered to be a trans mould via or TMV. Furthermore, at least one redistribution layer (RDL) may be formed on the upper and/or lower surface of the substrate 30. As will be understood by those skilled in the art an RDL is a metal, e.g. copper, layer which serves to redistribute or relocate electrical connections.

The substrate illustrated in FIG. 3 may be particularly useful in supporting a MEMS transducer since the hole 34 of the port-hole die allows the passage of acoustic pressure waves to a region directly above the upper surface of the substrate. This is illustrated in FIG. 4 which shows a cross-sectional view of a substrate 30 similar to the substrate illustrated in FIG. 3 and further comprising a discrete MEMS transducer die 100 provided in a region above the port-hole die. The MEMs transducer die may comprise a MEMS microphone transducer.

FIGS. 5*a* and 5*b* show a schematic diagram and a perspective view, respectively, of a known capacitive MEMS microphone die which may form the MEMS transducer die 100 illustrated in FIG. 4. The capacitive microphone comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1*a* the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110. A plurality of holes, hereinafter referred to as bleed holes 111, connect the first cavity 109 and the second cavity 110.

A plurality of acoustic holes 112 are arranged in the back-plate 104 so as to allow free movement of air molecules through the back plate, such that the second cavity 10 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 4 forms part of the back-volume which is typically enclosed by some other structure, such as a suitable package.

It should also be noted that whilst FIGS. 5*a* and 5*b* show the backplate being supported on the opposite side of the membrane to the substrate, arrangements are known where the backplate is formed closest to the substrate with the membrane layer supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown).

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

Thus, known transducer membrane structures are composed of two layers of different material—typically a dielectric layer (e.g. SiN) and a conductive layer (e.g. AlSi).

The substrate illustrated in any of FIG. 1, 2, 3 or 4, may form part of a package structure. Thus, a lid structure or cover may be provided on top of the substrate in order to define a chamber in the region above the upper surface of the substrate.

FIG. 6 shows cross-sectional view through a package 300 comprising a substrate 30 similar to the substrate illustrated in FIG. 4 and comprising an ASIC die 32*a* and a port hole die 32b. A MEMS microphone transducer die 100 is mounted to the upper surface of the substrate such that the flexible membrane 101 of the MEMS transducer overlies the hole 34 provided by the port hole die 32b. Thus, the hole 34 acts as an acoustic port of the package and allows the ingress of acoustic pressure waves into the region in front of the flexible membrane transducer. A lid structure, for example a metal lid, 200 is also mounted to the upper surface of the substrate 30 and defines a chamber within which the MEMS transducer 100 is housed. The composite substrate 30 thus serves as the package substrate. A first RDL layer 36a is formed on the upper side surface of the substrate 30 and a second RDL layer 36b is formed on the lower side surface of the substrate. A bond pad 37 is formed on the upper surface of the substrate and a conductive wire 39 is provided between the contact 37 and the MEMS transducer 100.

From consideration of FIG. 6 it will be appreciated that the ASIC is fully accommodated within the intra-planar region of the substrate 30. Thus, the ASIC component of the substrate does not protrude above the surface of the substrate. As a consequence, there is a beneficial gain in head room inside the chamber which forms the back volume of the microphone transducer.

Furthermore, according to one or more of the present examples the substrate forms the package substrate, with the lid structure being mounted on the primary substrate and thus obviating the need for a separate package substrate. Thus, a package incorporating a substrate according to one or more of the present examples which acts as the package substrate beneficially achieves a reduction in overall package height.

FIG. 7 illustrates a process flow for fabricating a package similar to the package shown in FIG. 6 according to one example. It will be appreciated that the process is a batch assembly process wherein a plurality of packages are fabricated at the same time.

In FIGS. 7a to 7c and ASIC die 32a and a port-hole die 32b are mounted side by side on a carrier 51. Each pair of ASIC die 32a and port-hole die 32b will form part of a composite substrate. Thus, the carrier tape supports a plurality of die pairs and allows the fabrication of an assembly of composite substrates. In this example the carrier comprises a tape formed on an upper surface of a carrier substrate. A substrate frame 31 is formed in the region laterally surrounding the ASIC and port hole die by a process of film assisted moulding. Specifically, moulding material is applied to the region laterally surrounding the two die e.g. using a film 53 or tool which defines one or more of the boundary surfaces of the intended substrate assembly. The moulding material may comprise e.g. a polymer or epoxy type material. The moulding material is preferably a hardenable or settable material which may be applied in liquid form and which, when hardened, serves to generate a rigid substrate structure. Thus, the ASIC die and the port-hole die are ultimately provided within the plane of the substrate and with a fixed positional relationship between them.

Figure 8A:
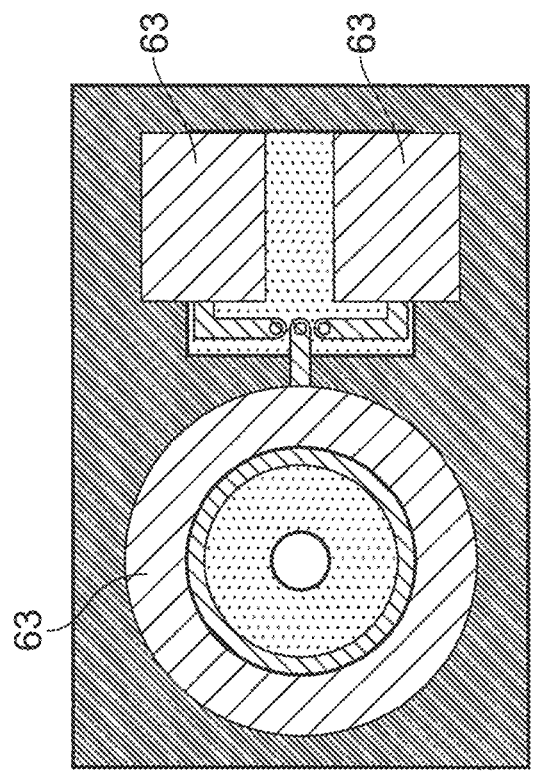
Figure 8B:
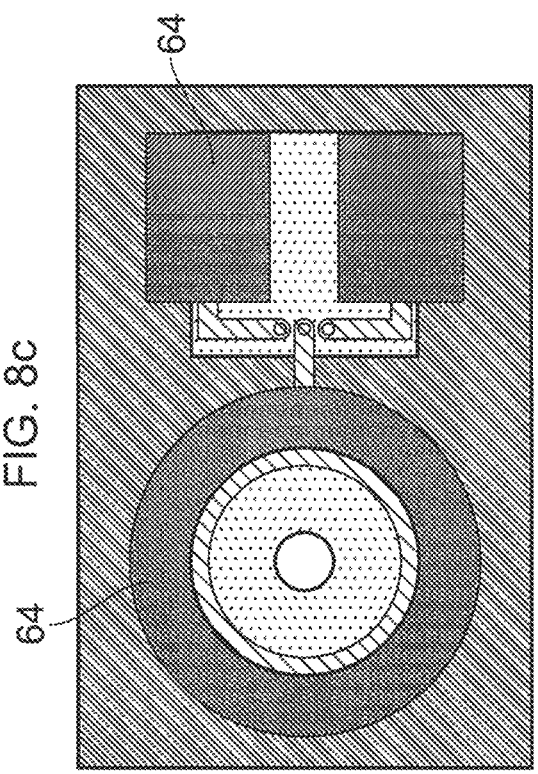
Figure 8C:
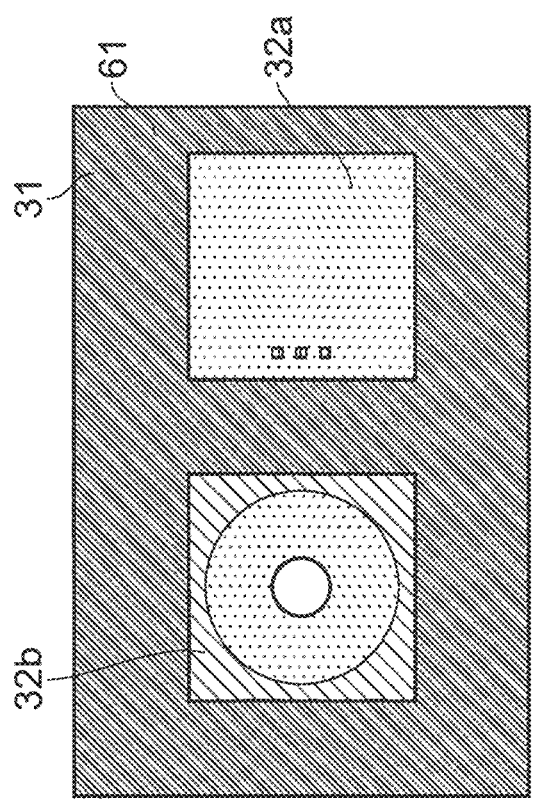
Figure 8D:
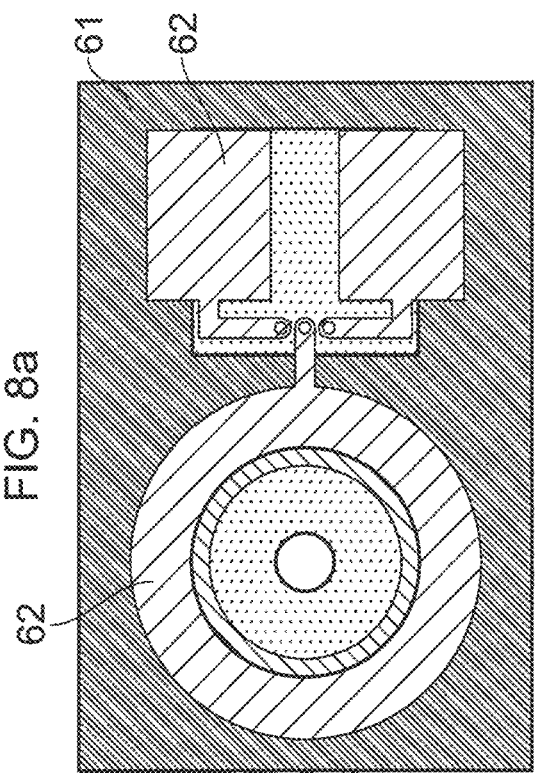
Figure 8G:
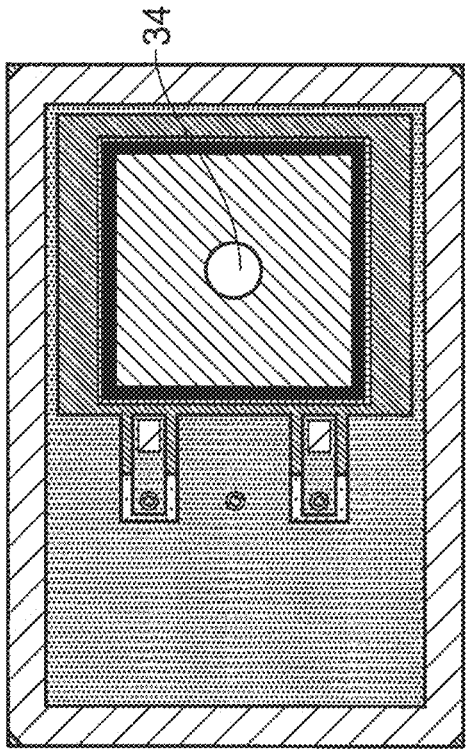
Figure 8H:
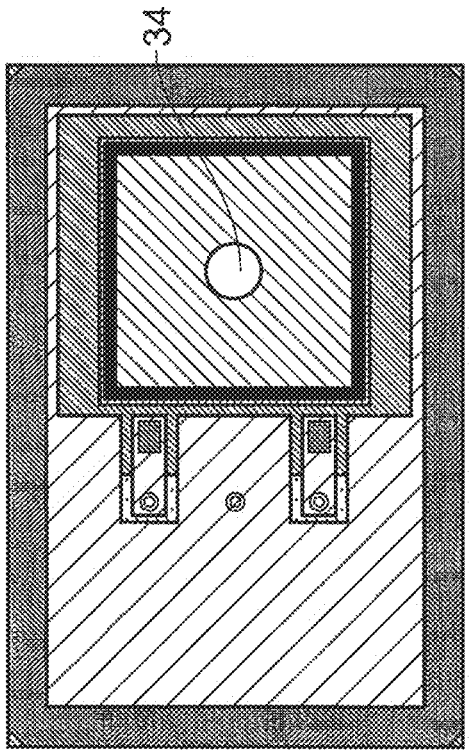
Figure 8E:
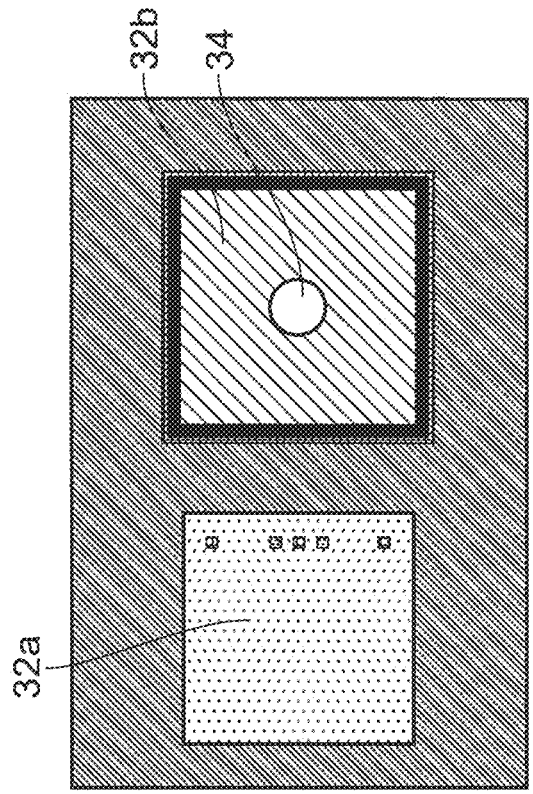
Figure 8F:
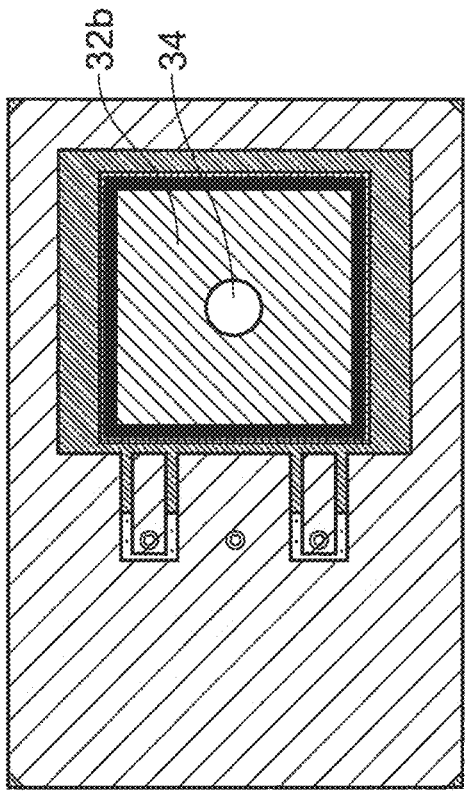

FIGS. 7d to 7h show further batch-level processing steps. To aid understanding, the processing of a single unit is also illustrated in FIGS. 8a to 8h which may be reviewed in conjunction with FIGS. 7d to 7h. Firstly, the substrate assembly is released from the carrier (FIG. 7d). As illustrated in FIG. 7e, the surface of the substrate assembly that will form the lower or back side of the substrates is then subject to an RDL process to form an RDL layer 36b which is illustrated in more detail in FIGS. 8a to 8c. Firstly, as illustrated in FIG. 8a a first layer of insulator (passivation) 61, e.g. a dielectric material, is applied leaving exposed only the bond pad interface on the ASIC die 32a. A copper patterning layer 62 is then applied (FIG. 8b) which will ensure appropriate electrical connection between the respective bond pad interfaces that will be used for soldering (such as I/O pads). As shown in FIG. 8c a second dielectric layer 63 is applied which will protect the copper surface of the electrical connection from oxidation and finally the bond pads a plated as shown in FIG. 8d.

As illustrated in FIG. 7f an RDL process is then applied to the other opposite surface of the substrate which will form the upper or top side surface. The steps are illustrated in FIGS. 8e to 8h and a similar to the steps of the RDL process carried out on the lower side surface and involve applying an insulator layer (passivation)—FIG. 8e, copper patterning—FIG. 8f, applying a second insulator layer (passivation)—FIG. 8g and plating—FIG. 8h.

Once the RDL processes have been completed, and as illustrated in FIG. 7g a MEMS die 100 is mounted to the upper surface of each of the substrates such that the flexible membrane of the substrate overlies the port hole of the port hole die 32b and a wire bond connection is made between the redistributed bond pads and the MEMS transducer. Finally, as shown in FIG. 7h, a lid 200 is attached to each substrate portion in order to define a plurality of packages. In a subsequent step (not shown) the packages are singulated.

There are a number of advantages associated with a wafer level fabrication process according to the present examples and as illustrated in FIGS. 7 and 8. In particular, the composite substrates are particularly suitable for fabrication by batch-level processing techniques. Embedding the ASIC within the package substrate—which will also be the sound port substrate according to at least one example—allows a bigger backside volume and/or a smaller cavity and/or a reduction in package size (X/Y or Z).

It will be appreciated that the sound port of the resultant package is provided by the silicon port-hole die. This beneficially allows improved accuracy in the definition of the sound port which may be formed accurately by silicon processing. Prior arrangements typically involve forming a port hole in a package substrate which comprises a PCB (printed circuit board) substrate.

In any of the above examples, it will be appreciated the, or each, component may exhibit a depth z that is less than, equal to, or greater than the depth (z-dimension) of frame which is defined by the distance between the upper and lower surfaces of the frame. Thus, whilst there may be a benefit in being able to fully accommodate the component between the first and second plane defined by the frame, so that the component does not protrude above the upper surface of the substrate, this is not essential. However, it will be appreciated that reducing or minimising the amount by which a component protrudes above the surface of the primary substrate may be particularly advantageous in examples where a chamber is to be defined—e.g. by means of a package lid structure or the like—in the region directly above the upper surface of the substrate and where the volume of that chamber has an impact on the performance of the packaged device. For example, in the case of a composite substrate comprising a port hole substrate as a first component and a circuitry die or ASIC as a second component, wherein a MEMS microphone transducer having a flexible membrane is to be formed so as to overlie the port hole, the chamber will form the back volume of the microphone transducer. Thus, according to one or more of the present examples, it is possible to achieve a gain in headroom inside the chamber and/or a reduction in package height in comparison to previously proposed microphone transducers as a consequence of the circuitry chip being substantially or even totally provided between the first and second plane defined by the frame.

Whilst examples of the present aspects are particularly applicable to structures for supporting MEMS sensor transducers, especially capacitive transducers such as MEMS microphones. It will also be appreciated that other types of MEMS capacitive sensors could be implemented, for example accelerometers, pressure sensors, proximity sensors or flow meters.

Examples of the present aspects may be implemented in a host device, especially a portable and/or battery powered host device such as a mobile telephone, and audio player, a video player, a PDA, a mobile computing platform such as a laptop computer or tablet and/or a games device for example or in an accessory device, such a headset, earbud (possibly noise-cancelling), or microphone assembly, designed for wired, or wireless connection with such host devices, possibly via multi-wire cables, multi-pole jacks, or optical fibres and connectors.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A composite substrate comprising a first intra-planar die and a second intra-planar die provided in a region between a first plane defined by an upper surface of the composite substrate and a second plane defined by a lower surface of the composite substrate, wherein the first die is an ASIC and the second die is a port-hole die, the port-hole die comprising a hole which extends through the die from an upper surface to a lower surface thereof, wherein the hole of the port-hole die allows the passage of acoustic pressure ways to a region directly above an upper surface of the substrate.

2. A method for fabricating a substrate of a MEMS transducer, the method comprising: applying mould material to a region laterally surrounding a first and second die to form a frame, each die having side surfaces, and hardening the mould material in order to form a bond between the material of the frame and the side surfaces of each die, wherein the first die is an ASIC and the second die is a port-hole die, the port-hole die comprising a hole which extends through the die from an upper surface to a lower surface thereof, wherein the hole of the port-hole die allows the passage of acoustic pressure waves to a region directly above an upper surface of the substrate.

* * * * *